United States Patent
De La Rosa et al.

(10) Patent No.: US 10,939,545 B2
(45) Date of Patent: Mar. 2, 2021

(54) METHODS AND APPARATUS FOR FLEX CIRCUIT AND CABLE ATTACHMENT SYSTEM

(71) Applicant: High Speed Interconnects, LLC, Scottsdale, AZ (US)

(72) Inventors: Antonio De La Rosa, Scottsdale, AZ (US); Todd Albertson, Portland, OR (US)

(73) Assignee: High Speed Interconnects, LLC, Scottsdale, AZ (US)

( * ) Notice: Subject to any disclaimer, the term of this patent is extended or adjusted under 35 U.S.C. 154(b) by 0 days.

(21) Appl. No.: 16/786,043

(22) Filed: Feb. 10, 2020

(65) Prior Publication Data
US 2020/0260575 A1    Aug. 13, 2020

Related U.S. Application Data

(60) Provisional application No. 62/803,202, filed on Feb. 8, 2019.

(51) Int. Cl.
| | | |
|---|---|---|
| H05K 1/03 | (2006.01) | |
| H05K 1/02 | (2006.01) | |
| H01R 12/59 | (2011.01) | |

(52) U.S. Cl.
CPC ......... *H05K 1/0277* (2013.01); *H01R 12/598* (2013.01); *H05K 1/0393* (2013.01); *H01R 2201/12* (2013.01); *H05K 2201/0397* (2013.01); *H05K 2201/10189* (2013.01); *H05K 2201/10356* (2013.01); *H05K 2201/10734* (2013.01)

(58) Field of Classification Search
CPC .................. H05K 1/0393; H05K 2201/09809
USPC ..................................... 439/63, 67
See application file for complete search history.

(56) References Cited

U.S. PATENT DOCUMENTS

| | | | | |
|---|---|---|---|---|
| 5,760,744 A | * | 6/1998 | Sauer | B32B 17/10036 29/600 |
| 6,903,934 B2 | * | 6/2005 | Lo | G02B 6/3897 361/709 |
| 6,963,265 B2 | * | 11/2005 | Cooper | H01C 1/144 257/E23.069 |
| 2002/0048974 A1 | * | 4/2002 | Michel | H05K 3/0064 439/67 |
| 2012/0330570 A1 | * | 12/2012 | Hedl | G01N 29/0645 702/39 |

* cited by examiner

*Primary Examiner* — Jeremy C Norris
(74) *Attorney, Agent, or Firm* — The Noblitt Group, PLLC

(57) ABSTRACT

A foldable modular flex circuit for attaching to at least one component. The flex circuit may comprise a central area and at least one tab depending from the central area. The central area may comprise a cable attachment section configured to electrically couple to at least one coaxial cable. A first tab may depend from the central area and is configured to electrically couple to a ball grid array (BGA) of the component. A second pair of tabs may depend from the central area and are configured to electrically couple to an additional at least one component, wherein each tab depends substantially perpendicular from the central area.

16 Claims, 4 Drawing Sheets

METHODS AND APPARATUS FOR FLEX CIRCUIT AND CABLE ATTACHMENT SYSTEM

CROSS-REFERENCES TO RELATED APPLICATIONS

The present application claims the benefit of U.S. Provisional Application Ser. No. 62/803,202, filed Feb. 8, 2019, entitled "Methods and Apparatus for Flex Circuit and Cable Attachment System" and incorporates the disclosure of the application by reference.

BACKGROUND OF THE TECHNOLOGY

Micro sensing components such as endoscopes, guidewires, catheters, cameras, and the like require small form factors that inherently create installation and manufacturing concerns for discrete cable or coaxial cable termination. For example, devices such as endoscopes, guidewires, catheters, or cameras typically have a ball grid array to facilitate the signal transfers to or from the device and/or to provide power. However, because these types of devices have size constraints on the order of 3 millimeters or less, cable design and proper termination of the cable at the device can be problematic.

Common methods of terminating insulated, shielded or coaxial cables to ball grid arrays (BGA) utilize direct connection to the BGA. These types of connections may create a manufacturing concern since connecting such a small length of wire within the space constraints of the assembly requires precision slowing down the manufacturing process and potentially leading to excessive manufacturing efficiencies or assembly quality problems.

Further, this type of connection increases the required termination region/distance and/or a corresponding outer diameter of the termination. This may lead to a situation where the outer diameter of the termination or the length of the termination region exceeds an allowed size constraint for a particular device type or application.

SUMMARY OF THE TECHNOLOGY

Methods and apparatus for a flex circuit and cable attachment system according to various aspects of the present technology include a modular holder assembly having enhanced connection and termination capabilities. In one embodiment, the flex circuit and cable attachment system comprises a modular flex circuit with a plurality of depending arms. The flex circuit and cable attachment system may also be configured to be connected horizontally or parallel to a component and vertically to a ball grid array or other additional circuitry.

BRIEF DESCRIPTION OF THE DRAWINGS

A more complete understanding of the present technology may be derived by referring to the detailed description and claims when considered in connection with the following illustrative figures. In the following figures, like reference numbers refer to similar elements and steps throughout the figures.

Figure 1:
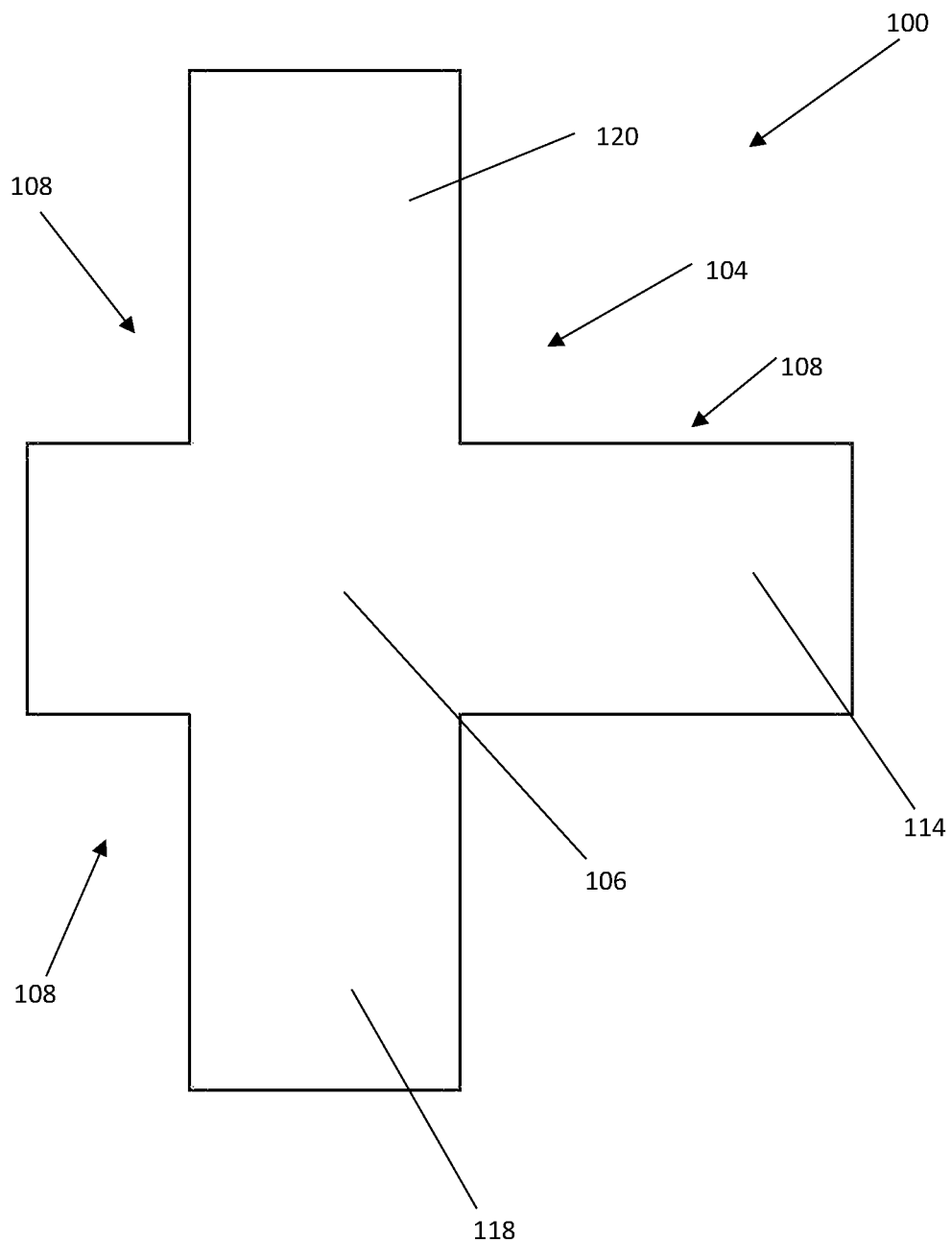
FIG. 1 representatively illustrates a modular view of a flex circuit and cable attachment system in accordance with an exemplary embodiment of the present technology.

Elements and steps in the figures are illustrated for simplicity and clarity and have not necessarily been rendered according to any particular sequence. For example, steps that may be performed concurrently or in a different order are illustrated in the figures to help to improve understanding of embodiments of the present technology.

DETAILED DESCRIPTION OF EXEMPLARY EMBODIMENTS

The present technology may be described in terms of functional block components and various processing steps. Such functional blocks may be realized by any number of hardware or software components configured to perform the specified functions and achieve the various results. For example, the present technology may employ various cables, sensors, dielectrics, connection types, circuit cards/boards, and the like, which may carry out a variety of analog or digital functions, such as MIPI, I2C, LVDS or any other suitable configuration. The signals may comprise any suitable electrical signals, for example a combination of data, control signals, and power. In addition, the present technology may be practiced in conjunction with any number of applications, and the system described is merely one exemplary application for the technology. Further, the present technology may employ any number of conventional techniques for providing analog or digital (MIPI) control signals, reducing noise, cross-talk, attenuation, impedance, controlling power, and the like.

Methods and apparatus for a flex circuit and cable attachment system according to various aspects of the present technology may operate in conjunction with any suitable electronic sensor, video system, data collection system, and/or other electronic device. Various representative implementations of the present technology may be applied to any appropriate system for imaging such as a temporarily insertable camera system like an endoscope or any other suitable technology.

A flex circuit as known by one of ordinary skill in the art, may comprise an electronic circuit that is mounted on a flexible plastic substrate, such as polyimide, PEEK, or any suitable conductive polyester film. Standard flex circuits may be used as connectors in various applications where flexibility, space savings, or production constraints limit the applicability of rigid circuit boards or hard wiring.

Referring now to FIGS. 1-4, a flex circuit and cable attachment system 100 according to various aspects of the present technology may be used to connect coaxial cables 102 to various components within micro sensing components such as endoscopes, guidewires, catheters, cameras, and the like. The cable attachment system may comprise a flexible plastic substrate, such as polyimide, PEEK, or any suitable conductive polyester film.

The coaxial cables 102 are used to transmit signals from a source device at a source end to a receiving end such as a display or memory device. The signals may comprise any suitable electrical signals, for example a combination of data, control signals, and power. For example, in one embodiment for use with an imaging system using a camera, a first coaxial cable may provide electrical power to the camera. The camera may be configured with an integrated circuit such as a CMOS imaging sensor, an array, a BGA, or other sensing device that is connected directly to the flex circuit and cable attachment system 100. A second coaxial cable may transmit a clock signal between the camera and the receiving end of the flex circuit and cable attachment system 100. A third coaxial cable may transmit an image signal from the camera to the receiving end where the image signal may be displayed or analyzed for processing. In alternative embodiments, additional coaxial cables may be included to transmit additional power lines or signals as required. Similarly, fewer cables may be used if the particular application requires the transmission of fewer signals or less power lines through the flex circuit and cable attachment system 100. Insulated (non-coaxial) cables are also contemplated with the present technology.

The coaxial cables 102 may comprise any suitable type of coaxial cable, such as a cable comprising a center conductor, a dielectric surrounding the center conductor, and a shield covering the dielectric.

Figure 2:
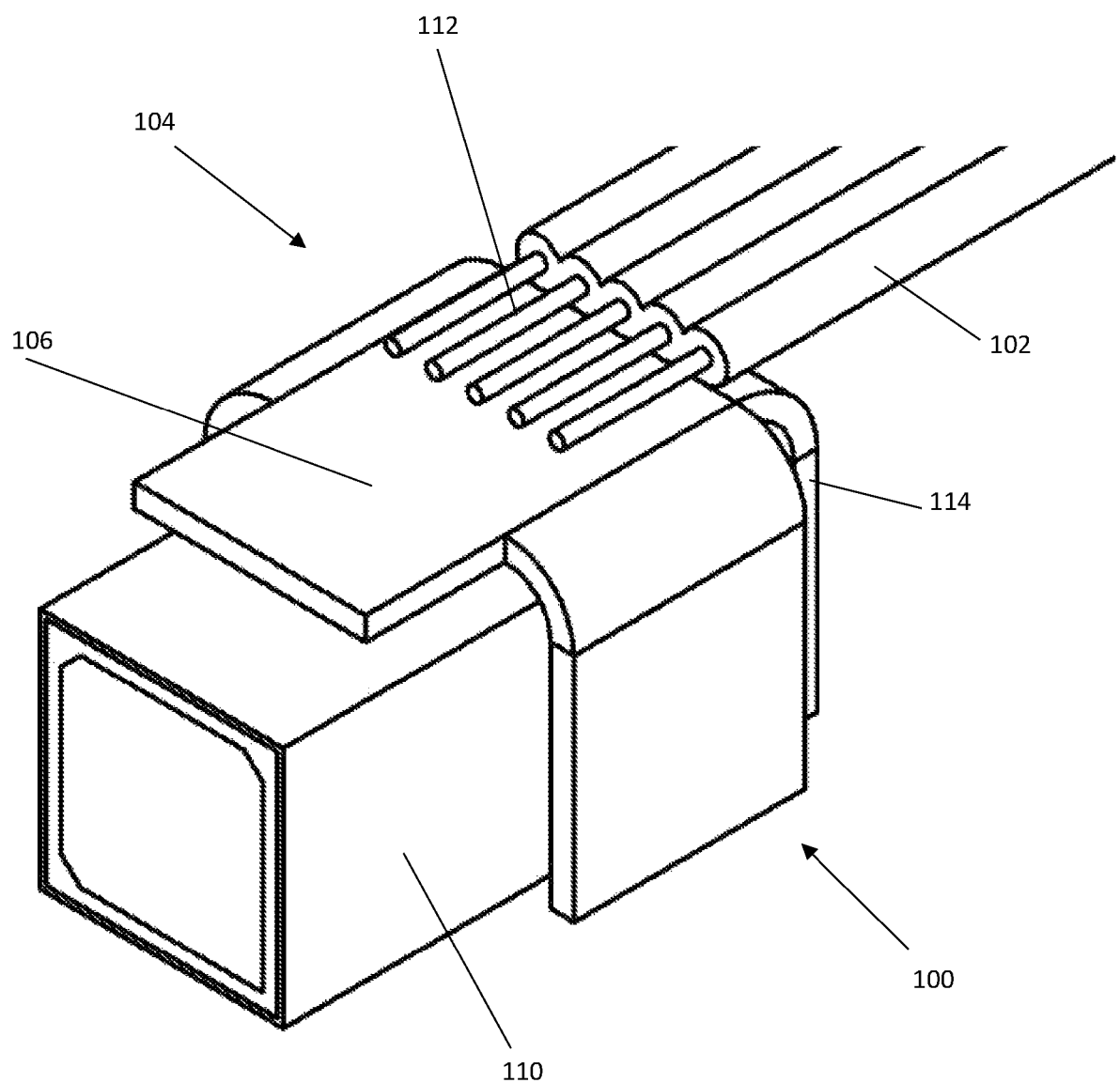
FIG. 2 representatively illustrates a folded modular view of the flex circuit and cable attachment system in accordance with an exemplary embodiment of the present technology.
Figure 3:
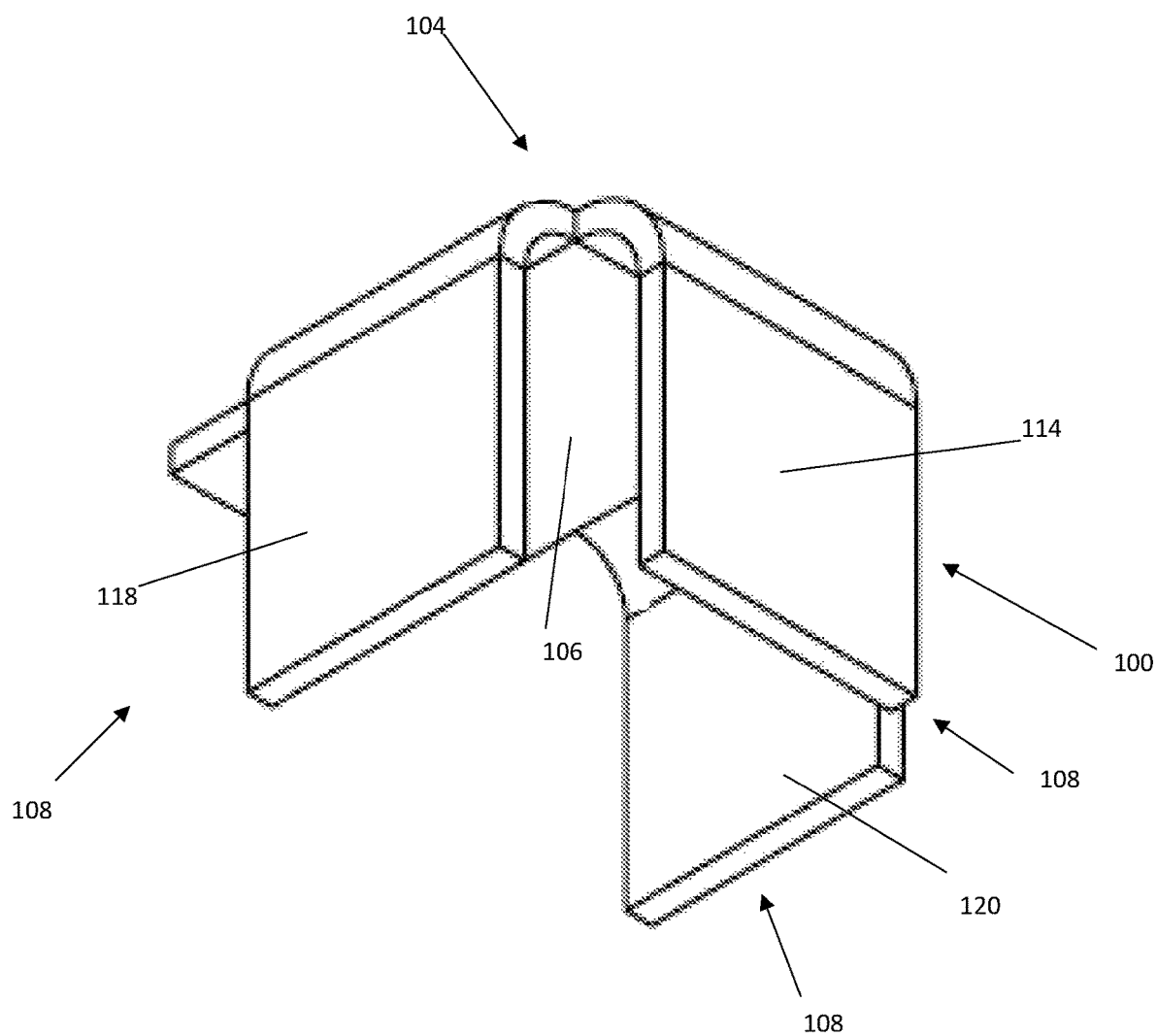
FIG. 3 representatively illustrates a perspective view of the flex circuit and cable attachment system in accordance with an exemplary embodiment of the present technology along with coaxial cables and a component.
Figure 4:
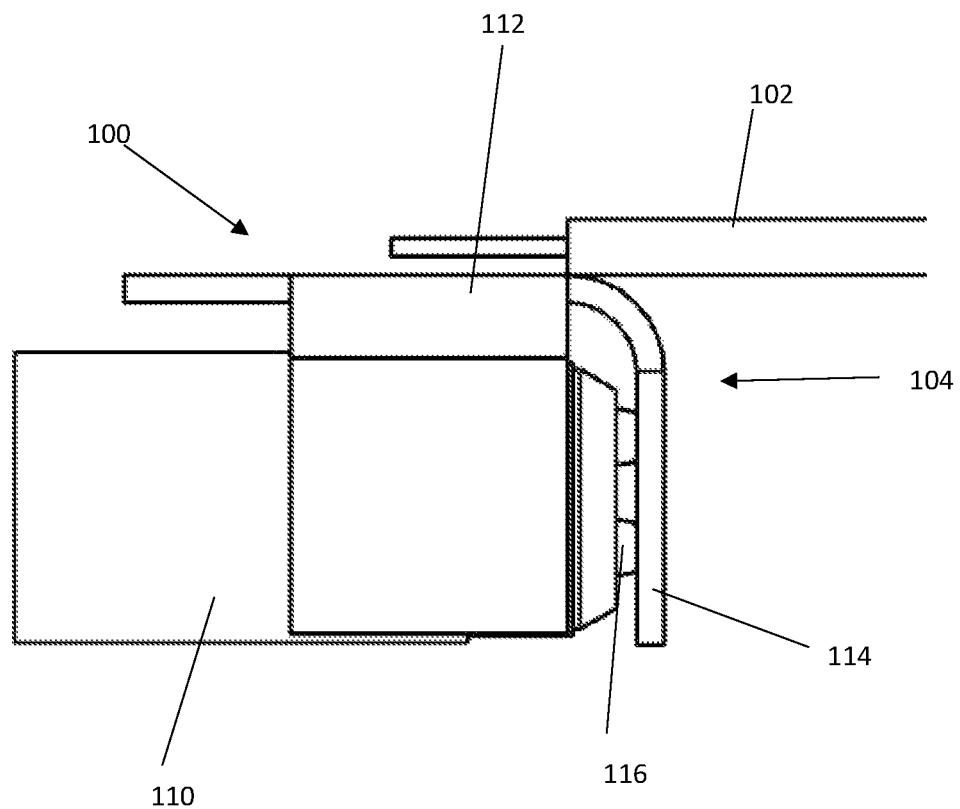
FIG. 4 representatively illustrates a side view of the flex circuit and cable attachment system in accordance with an exemplary embodiment of the present technology along with coaxial cables and a component with a BGA.

The flex circuit and cable attachment system 100 comprises a modular flex circuit 104 having a central area 106 and a plurality of tabs 108. The modular flex circuit 104 is flexible such that it can attach and conform to various components 110, such as shown in FIGS. 3 and 4. FIG. 1 shows the modular flex circuit 104 prior to folding. FIG. 2 shows the modular flex circuit 104 after folding. FIGS. 3 and 4 show the folded modular flex circuit 104 with coaxial cables 102 configured to be attached thereto. Specifically, the coaxial cables 102 may be coupled to a cable attachment section 112 located on the central area 106. The plurality of tabs 108 depend from the central area 106 to wrap around the side or ends of the component 110. The tabs 108 are configured and designed to be moldable to any suitable shape. The plurality of tabs 108 may comprise a BGA pad 114, which is used to connect modular flex circuit 104 to a BGA 116 of the component 110 and is electrically coupled to the cable attachment section 112 to provide a signal path between each cable and a corresponding location on the BGA 116. The plurality of tabs 108 may also comprise additional wings 118, 120 to connect to additional circuitry.

For example, and referring now to FIGS. 3 and 4, in one embodiment, the component 110 may comprise a micro-camera having a surface-mount interface, such as a CMOS chip with a BGA 116 positioned on a surface of the micro-camera. As such, the coaxial cables 102 may be attached horizontally via the cable attachment section 112 located on the central area 106 on an upper surface of the component 110 while the BGA pad 114 is attached vertically to the BGA 116 of the component 110, behind the component 110. As such the surface of the cable attachment section 112 located on the central area 106 is oriented at approximately ninety degrees from the surface of the BGA pad 114.

Connecting the coaxial cables 102 on the upper surface of the component 110 of provides a low profile and uses less space than existing attachment methods. In addition, the coaxial cables 102 may be indirectly coupled to the BGA via the folded modular flex circuit 104. For example, a camera used in medical procedures when combined with the folded modular flex circuit 104 may be limited to having a maximum outer diameter of the less than 2 millimeters. Other applications may have even stricter requirements such that the diameter of the folded modular flex circuit 104 when combined with the component must be less than about 1 millimeter. Having a smaller diameter of the outer diameter of the folded modular flex circuit 104 may allow the selected components to be used in additional applications that require a small form longitudinal or horizontal termination factor but still require the ability to transmit multiple power or signals over any bandwidth or attenuation.

A person of ordinary skill in the art would appreciate that the modular flex circuit 104 further simplifies the process of assembling or removing components from an endoscope tip.

This method of connecting the coaxial cables 102 to the BGA of a component may also provide an improved ability for flexing between the micro-camera 4 and the cable assembly. For example, camera systems that are used to view inside the human body often require that the camera system be able to bend and adjust according to a component inner diameter used to penetrate or diagnose a human body, such as a scope, catheter, guidewire, or flexible introducer sheath. Because of this, the folded modular flex circuit 104 may have to be flexible, both overall and in the area adjacent to the camera system where the two devices are coupled together. Indirect vertical attachment of the coaxial cables 102 to the BGA via the folded modular flex circuit 104 may also reduce back-end termination dimensions lessening the distance from the micro-camera that the cable assembly can be terminated or flexed independently from the micro-camera.

These and other embodiments for methods of forming a flex circuit and cable attachment system 100 may incorporate concepts, embodiments, and configurations as described above. The particular implementations shown and described are illustrative of the technology and its best mode and are not intended to otherwise limit the scope of the present technology in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components.

As used herein, the terms "comprises," "comprising," or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A foldable modular flex circuit for attaching to at least one component, the flex circuit comprising:
   a central area comprising a cable attachment section configured to electrically couple to at least one cable;
   a first tab depending from the central area and configured to electrically couple to a ball grid array (BGA) of the component; and
   a pair of tabs depending from the central area and configured to electrically couple to an additional at least one component, wherein the pair of tabs conform to the shape of the component.

2. The foldable modular flex circuit of claim 1, wherein the first tab depends substantially perpendicular from the central area.

3. The foldable modular flex circuit of claim 1, wherein the pair of tabs depend substantially perpendicular from the central area.

4. The foldable modular flex circuit of claim 1, wherein the cable attachment section is configured to electrically couple at least one coaxial cable horizontally.

5. The foldable modular flex circuit of claim 4, wherein the cable attachment section is configured to electrically couple at least one coaxial cable horizontally and the connection to the BGA is perpendicular to the cable attachment section.

6. The foldable modular flex circuit of claim 1, wherein the central area comprises a cable attachment section configured to electrically couple more than one coaxial cable.

7. The foldable modular flex circuit of claim 1, wherein the foldable modular flex circuit comprises a conductive polyester film material.

8. The foldable modular flex circuit of claim 1, wherein the foldable modular flex circuit comprises a PEEK material.

9. The foldable modular flex circuit of claim 1, wherein the at least one cable comprises coaxial cable.

10. A foldable modular flex circuit for attaching to at least one component, the flex circuit comprising:
    a central area comprising a cable attachment section configured to electrically couple to at least one coaxial cable;
    a first tab depending from the central area and configured to electrically couple to a ball grid array (BGA) of the component; and
    a second pair of tabs depending from the central area and configured to electrically couple to an additional at least one component, wherein each tab depends substantially perpendicular from the central area and conform to the shape of the component.

11. The foldable modular flex circuit of claim 10, wherein the cable attachment section is configured to couple at least one coaxial cable horizontally.

12. The foldable modular flex circuit of claim 11, wherein the cable attachment section is configured to electrically couple at least one coaxial cable horizontally and the connection to the BGA is perpendicular to the cable attachment section.

13. The foldable modular flex circuit of claim 10, wherein the central area comprises a cable attachment section configured to electrically couple more than one coaxial cable.

14. The foldable modular flex circuit of claim 10, wherein the foldable modular flex circuit comprises a conductive polyester film material.

15. The foldable modular flex circuit of claim 10, wherein the foldable modular flex circuit comprises a PEEK material.

16. The foldable modular flex circuit of claim 10, wherein the at least one cable comprises coaxial cable.

* * * * *